(12) United States Patent
Jeon

(10) Patent No.: US 9,239,755 B2
(45) Date of Patent: Jan. 19, 2016

(54) SEMICONDUCTOR DEVICE AND SEMICONDUCTOR SYSTEM INCLUDING THE SAME

(71) Applicant: SK HYNIX INC., Icheon (KR)

(72) Inventor: Seon Kwang Jeon, Icheon (KR)

(73) Assignee: SK HYNIX INC., Icheon (KR)

( * ) Notice: Subject to any disclaimer, the term of this patent is extended or adjusted under 35 U.S.C. 154(b) by 107 days.

(21) Appl. No.: 14/167,880

(22) Filed: Jan. 29, 2014

(65) Prior Publication Data

US 2015/0106678 A1    Apr. 16, 2015

(30) Foreign Application Priority Data

Oct. 14, 2013 (KR) .................. 10-2013-0121997

(51) Int. Cl.
*G06F 11/10* (2006.01)
*G11C 11/4096* (2006.01)
*G11C 29/04* (2006.01)
*G11C 7/10* (2006.01)

(52) U.S. Cl.
CPC ........ *G06F 11/1048* (2013.01); *G06F 11/1008* (2013.01); *G06F 11/1032* (2013.01); *G11C 11/4096* (2013.01)

(58) Field of Classification Search
CPC ............ G06F 11/1008; G06F 11/1032; G06F 11/1048; G11C 11/4096; G11C 2029/0411; G11C 7/1006
USPC .................................................. 714/773, 801
See application file for complete search history.

(56) References Cited

U.S. PATENT DOCUMENTS

| | | | |
|---|---|---|---|
| 6,535,452 B2 * | 3/2003 | Okuda et al. | 365/230.03 |
| 7,653,861 B2 * | 1/2010 | Kanai et al. | 714/758 |
| 8,065,589 B2 * | 11/2011 | Iida | 714/763 |
| 2011/0246712 A1 | 10/2011 | Vergis et al. | |
| 2011/0307769 A1 * | 12/2011 | Ramaraju et al. | 714/801 |
| 2013/0031439 A1 * | 1/2013 | Moon et al. | 714/758 |
| 2013/0275830 A1 * | 10/2013 | Park | 714/758 |
| 2014/0245105 A1 * | 8/2014 | Chung et al. | 714/763 |
| 2015/0089316 A1 * | 3/2015 | Zhang et al. | 714/755 |

* cited by examiner

*Primary Examiner* — James C Kerveros

(57) ABSTRACT

A semiconductor system includes a memory configured to output a parity bit during a read operation and receive a data mask (DM) signal during a write operation. The semiconductor system also includes a System On Chip (SOC) configured to detect errors by decoding the parity bit during the read operation, and output the DM signal to the memory during the write operation. Since the parity bit is generated in the memory based on data received from outside the memory, the semiconductor device and a corresponding semiconductor system may reduce the size of a storage space for parity bits.

19 Claims, 3 Drawing Sheets

SEMICONDUCTOR DEVICE AND SEMICONDUCTOR SYSTEM INCLUDING THE SAME

CROSS-REFERENCE TO RELATED APPLICATION

This application claims priority based upon Korean patent application No. 10-2013-0121997, filed on Oct. 14, 2013, the disclosure of which is hereby incorporated by reference in its entirety herein.

BACKGROUND

Embodiments of the present disclosure relate to a semiconductor device and a semiconductor system including the same, and more particularly to a technology for reducing the size of a storage space of parity bits of the semiconductor device.

Due to limitation in operation speed of a semiconductor memory device such as a Dynamic Random Access Memory (DRAM), single data rate (SDR) memories acting as synchronous semiconductor memory devices have been widely used to increase operation speeds of semiconductor memory devices. Synchronous semiconductor memory devices may operate in synchronization with a rising edge of a system clock. The operation speed of the synchronous semiconductor memory devices has been increasing.

Technology of such higher-speed semiconductor memory devices continues to develop with the advent of a double data rate (DRR) memories operating in response to a rising edge and a falling edge of the system clock. Likewise, SDR and DDR memories have become a mainstream of current memory devices in consideration of a user request or characteristics of application products.

Meanwhile, each of SDR and DDR memories has a DQ mask function, where "DQ" is an input/output (I/O) channel of data, and the term "mask" indicates an operation for suppressing input/output of data.

A DQ mask (also Data Mask (DM) herein) signal obstructs progression of some data during the read or write operation, such that the data is not actually read from or written into semiconductor memory devices. For example, SDR and DDR memories generate a DM command for suppressing input data from being written into memory cells during a data write operation.

In more detail, the SDR memory synchronizes the DM signal generated from a DM buffer with a clock signal to generate a DM signal. The DDR memory synchronizes an output signal of a DM buffer with a clock signal for a data strobe (DS) signal of a memory controller. As a result, the DDR memory is synchronized with the output of the DS signal to generate a DM signal.

When performing a termination test of semiconductor memory devices on a wafer, the termination test of a data mask (DM) pad is omitted to improve efficiency of the termination test.

Memory modules associated with a computing device are generally used to process two types of data, i.e., general data and graphic data. For example, processing the graphic data may include displaying image(s) on a screen. A memory module associated with such graphic processing may include a DM module.

The DM module is designed to improve operation of DRAM(s). The data mask (DM) is desired for performing data read or write operation for DRAM(s) at a high speed during a graphic processing time.

The aforementioned high-speed read and write operations of data between the DM module and each of the DRAM(s) are performed using a DM bit signal being input/output to/from a data bus of the corresponding DRAM. For example, the DM bit signal is used to mask a data line to suppress a write operation into a DRAM associated with the DM bit signal.

As the operation frequency of a semiconductor device is increasing to make the operation speed of the semiconductor device faster, the number of data bits simultaneously input/output to/from the semiconductor device is also increasing. As a result, the number of pads arranged in the semiconductor device also continues to increase.

SUMMARY

Various embodiments are directed to providing a semiconductor device and a semiconductor system including the same that substantially address one or more issues due to characteristics of the related art.

Embodiments relate to a technology for reducing a parity-bit storage space of the semiconductor device by transferring parity bits using a transfer path of a data mask (DM) pad.

According to an embodiment, a semiconductor device includes: a parity-bit generator configured to generate a parity bit according to a parity-bit selection signal; a selector configured to output the parity bit through a transfer path of a data mask (DM) signal in response to a selection signal; and a decoder configured to receive and decode the data mask (DM) signal during a write operation.

The semiconductor device may further include: a data pad configured to output data to the parity-bit generator; and a data mask (DM) pad configured to receive the data mask (DM) signal from the decoder.

The selector may select a parity signal received from the parity-bit generator during a read operation and output the selected parity signal to a first channel, and does not operate by the selection signal during the write operation.

The decoder may decode the data mask (DM) signal received from a first channel during the write operation, and does not operate by the selection signal during the read operation.

The semiconductor device may further include a data pad configured to receive a parity bit received from a second channel during the write operation of the parity bit.

The parity-bit generator may include a plurality of exclusive-OR (XOR) gates configured to an exclusive-OR (XOR) operation between the parity-bit selection signal and several data pieces.

The parity-bit generator may include an even-parity generator configured to detect an odd parity. The parity-bit generator may include an odd-parity generator configured to detect an even parity.

According to an embodiment, a semiconductor system includes: a memory configured to output a parity bit through a transfer path of a data mask (DM) signal during a read operation, and receive the data mask (DM) signal through a transfer path of the data mask (DM) signal during a write operation; and a System On Chip (SOC) configured to detect errors by decoding the parity bit during the read operation, and output the data mask (DM) signal to the memory during the write operation.

The memory may include: a parity-bit generator configured to generate the parity bit according to a parity-bit selection signal; a selector configured to output the parity bit through a transfer path of the data mask (DM) signal in response to a selection signal; and a decoder configured to receive and decode the data mask (DM) signal during the write operation.

The memory may include: a data pad configured to output data to the parity-bit generator; and a data mask (DM) pad configured to receive the data mask (DM) signal from the decoder.

The selector selects the parity bit received from the parity-bit generator during the read operation and outputs the selected parity bit to a first channel, and does not operate by the selection signal during the write operation.

The decoder may decode the data mask (DM) signal received from a first channel during the write operation, and does not operate by the selection signal during the read operation.

The semiconductor system may further include a data pad configured to receive a parity bit received from a second channel during the write operation of the parity bit.

The parity-bit generator may include an even-parity generator configured to detect an odd parity.

The parity-bit generator may include an odd-parity generator configured to detect an even parity.

The system on chip (SOC) may further include a mask pad configured to output the data mask (DM) signal to the memory during the write operation. The system on chip (SOC) further may include a data pad configured to output the parity bit to the memory during the write operation of the parity bit. The system on chip (SOC) may further include a parity-bit decoder configured to detect the parity bit during the read operation. The system on chip (SOC) may further include an error detector configured to detect errors from output data of the parity-bit decoder.

It is to be understood that both the foregoing general description and the following detailed description of the present disclosure are exemplary and explanatory and are intended to provide further explanation of the invention as claimed.

BRIEF DESCRIPTION OF THE DRAWINGS

The above and other features and aspects of the present disclosure will be apparent by reference to the following detailed description when considered in conjunction with the accompanying drawings wherein.

DESCRIPTION

Reference will now be made in detail to various embodiments of the present disclosure, examples of which are illustrated in the accompanying drawings. Wherever possible, the same reference numbers will be used throughout the drawings to refer to the same or like parts.

Figure 1:
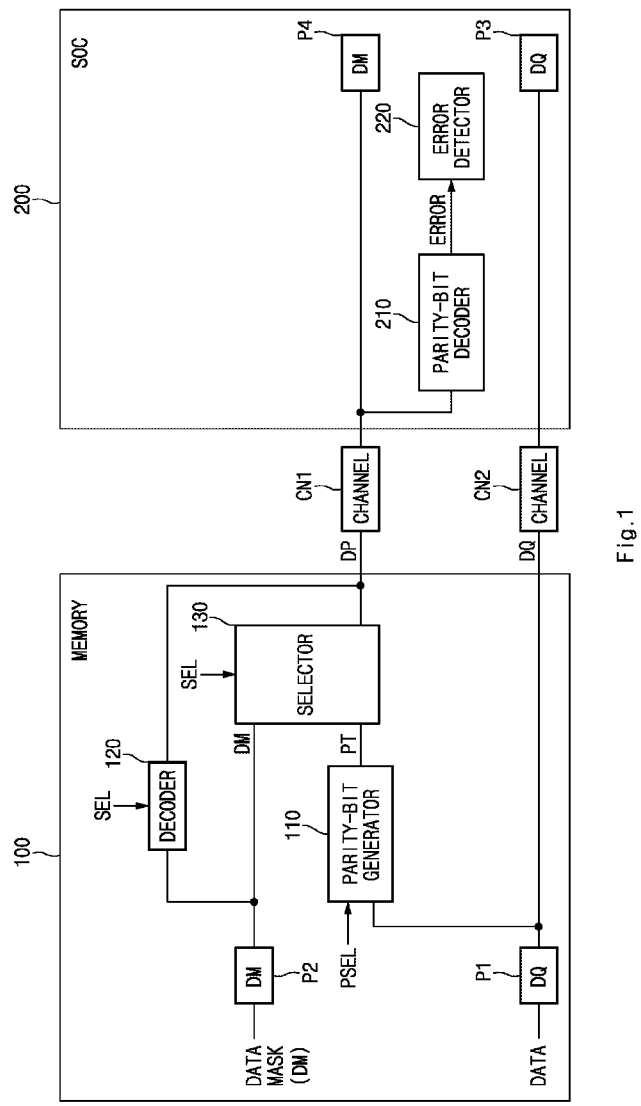
FIG. 1 is a block diagram illustrating a semiconductor system according to an embodiment.

FIG. 1 is a block diagram illustrating a semiconductor system according to an embodiment.

Referring to FIG. 1, the semiconductor system according to this embodiment includes a memory 100 and a system on chip (SOC) 200. Here, the memory 100 and the SOC 200 are interconnected through first and second channels CN1 and CN2.

The memory 100 includes a data (DQ) pad P1, a data mask (DM) pad P2, a parity bit generator 110, a decoder 120, and a selector 130. The SOC 200 includes a parity bit decoder 210, an error detector 220, a data (DQ) pad P3, and a data mask (DM) pad P4.

Conventionally, when an error correcting code (ECC) is received by a semiconductor device, an additional storage space is allocated to store the ECC in the semiconductor device. A storage cell and an additional control circuit for controlling the storage cell may be also desirable. Moreover, additional bits may be allocated to an interface so as to generate the ECC.

However, the semiconductor device according to this embodiment does not receive an ECC or parity bit(s) from an external part, but instead generates the parity bit(s) in the semiconductor device in order to save a storage space. Accordingly, additional bits for data storage may not be allocated to the interface. For example, the semiconductor device according to this particular embodiment generates parity bit(s) on the basis of data received through a transfer path of a data mask (DM) pad.

The semiconductor device according to this embodiment is characterized in that the parity bit generator 110 and the selector 130 in the memory 100. Therefore, parity bits are generated from the parity bit generator 110 in the memory 100. During a read operation mode of parity bits, the parity bits generated from the parity bit generator 110 are transmitted to the SOC 200 through a transfer path of the DM signal between the selector 130 and the channel CN1.

The memory 100 and the SOC 200 using a high-speed interface, may generate errors during signal transmission. Accordingly, parity bits are allocated to the interface between the memory 100 and the SOC 200 to detect parity error(s) during signal transmission. The semiconductor device according to an embodiment can transmit parity bit(s) using a transfer path of a data mask (DM) pad P2 without using an additional pad for allocating parity bit(s).

The DM signal suppresses input/output of some data during a write operation, such that the data is not actually written into the semiconductor device. The DM signal may indicate whether input data is masked or not. If data having the same logic state as that of another data stored in the memory 100 is to be written into the memory 100, the masking operation is performed so that the data is not transmitted for the write operation. Accordingly, the DM signal is used during the write operation of the memory 100. On the other hand, the DM signal may not be required during a read operation of the memory 100. As a result, the DM pad P2 may not be used in the read operation.

According to an embodiment, a transfer path of the DM signal between the selector 130 and the channel CN1 is used for transmission of parity bit(s). In addition, errors in output data of the memory 100 can be verified by the SOC 200 once more.

The data pad P1 outputs data to the parity bit generator 110 of the memory 100 and an external channel CN1, and receives data from another external channel CN2. The data pad P1 may provide data received from an external part of the memory 100 to the SOC 200 through the selector 130, and may receive data entered through the external channel CN2 from the SOC 200. The DM pad P2 may output a DM signal DM to the selector 130, and receive the DM signal from the decoder 120.

The parity bit generator 110 may generate a parity signal PT in response to a parity-bit selection signal PSEL, and output the parity signal PT to the selector 130. The parity-bit selection signal PSEL may be used to determine whether to detect an odd parity bit (e.g., "1") or an even parity bit (e.g., "0") among bits of data received from the data (DQ) pad P1. For example, when the parity-bit selection signal PSEL has a logic high value (e.g., "1"), the number of ones in the received data may be detected. When the parity-bit selection signal PSEL has a logic low value (e.g., "0"), the number of zeros in the received data may be detected.

The decoder 120 decodes data received from the channel CN1 in response to the selection signal SEL, and thus outputs the decoded result to the DM pad P2. The decoder 120 operates by the selection signal SEL during the write operation of data mask DM data, and transmits data to the DM pad P2.

The selector 130 may select one of the DM signal DM received from the DM pad P2 and the parity signal PT received from the parity bit generator 100, and output a selection signal DP according to the selection result. The selection signal DP generated from the selector 130 is transmitted to the parity bit decoder 210 of the SOC 200 through the channel CN1.

The parity bit decoder 210 decodes the selection signal DP transmitted through the channel CN1 and outputs an error signal ERROR to the error detector 220. The error detector 220 may determine whether an error occurs during data transmission in response to an output signal ERROR of the parity bit decoder 210.

The SOC 200 receives a command signal, an address, and data from an external part, so that the data can be written into or read from the memory 100. The memory 100 may perform the read or write operation of data by a control signal generated from the SOC 200.

The SOC 200 has more flexibility than the memory 100 in terms of a driver size, drivability, and the like. Signal Integrity (SI) issues between the memory 100 and the SOC 200 may arise when data of the memory 100 is transmitted to the SOC 200 or data of the SOC 200 is transmitted to the memory 100.

SI issues may be addressed by generating a parity signal in one of the memory 100 and the SOC 200, and detecting a transmitted signal in the other of the memory 100 and the SOC 200. Since the SI issues may arise more frequently during transmission of data from the memory 100 to the SOC 200 than during transmission of data from the SOC 200 to the memory 100, it may be more effective for addressing the SI issues to include the parity bit generator 110 in the memory 100 than in the SOC 200. Thus, an embodiment is characterized in that the parity bit generator 110 is in the memory 100.

As described above, according to an embodiment, a data transfer path in the parity mode may differ from that in the DM mode.

Figure 2:
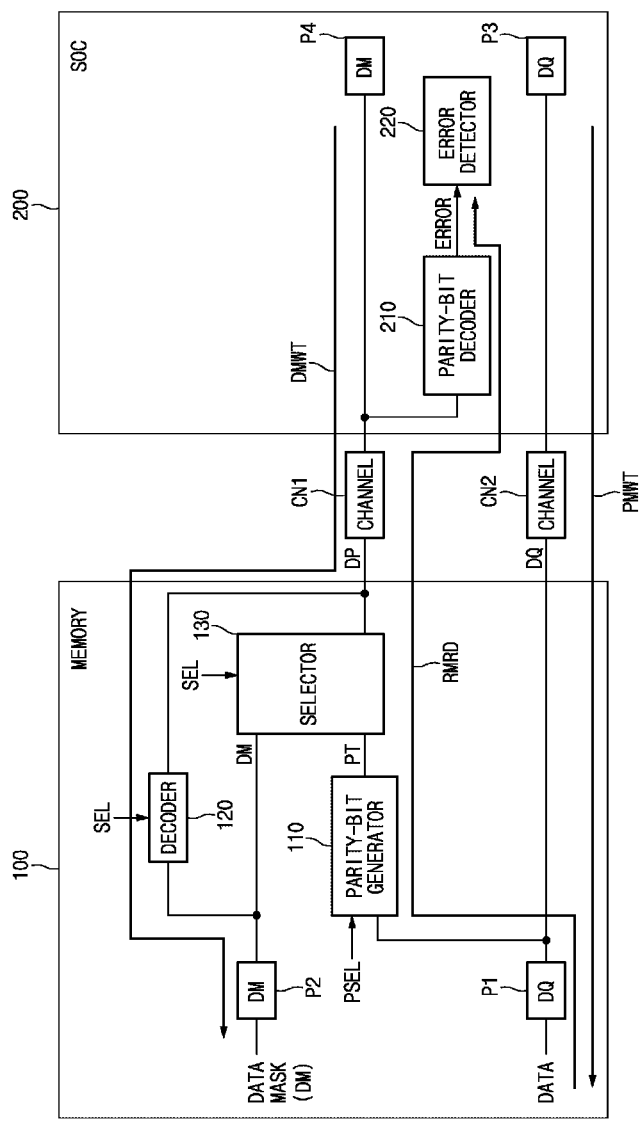
FIG. 2 is a conceptual diagram illustrating signal transfer paths in a DM mode and parity modes according to the embodiment shown in FIG. 1.

FIG. 2 is a conceptual diagram illustrating signal transfer paths in a DM mode and in parity modes according to the embodiment shown in FIG. 1. Referring to FIG. 2, in a parity mode during a memory read operation RMRD, the selector 130 may select a parity signal PT of the parity bit generator 110 according to the selection signal SEL. The decoder 120 does not operate by the selection signal SEL.

Accordingly, in the parity mode during a memory read operation RMRD, parity bits of the memory 100 are transmitted to the SOC 200 through the channel CN1. Data output from the data pad P1 of the memory 100 is transferred as the selection signal DP through the parity bit generator 110 and the selector 130. The selection signal DP is transmitted through the channel CN1 and transmission paths along the parity bit decoder 210 and the error detector 220 of the SOC 200.

According to this embodiment, the output line of the selection signal DP is used as a path for transmitting parity bits in the parity mode during a memory read operation RMRD. However, the output line of the selection signal DP is also used as a transmission path through which DM data is output.

In a data mask mode during a memory write operation DMWT, the selector 130 does not operate in response to the selection signal SEL. The decoder 120 starts operation in response to the selection signal SEL, so that the DM signal is transmitted to the DM pad P2.

Accordingly, in the data mask mode during the memory write operation DMWT, DM data of the SOC 200 is transmitted to the memory 100 through the channel CN1. The DM data transmitted through the DM pad P4 of the SOC 200 is output to the memory 100 through the channel CN1. The DM data is transmitted through transmission paths along the decoder 120 and the DM pad P2 of the memory 100.

In a parity mode during the memory write operation PMWT, data of the SOC 200 is transmitted to the memory 100 through the channel CN2. Data output from the data pad P3 of the SOC 200 is transmitted to the data pad P1 of the memory 100 through the channel CN2.

Figure 3:
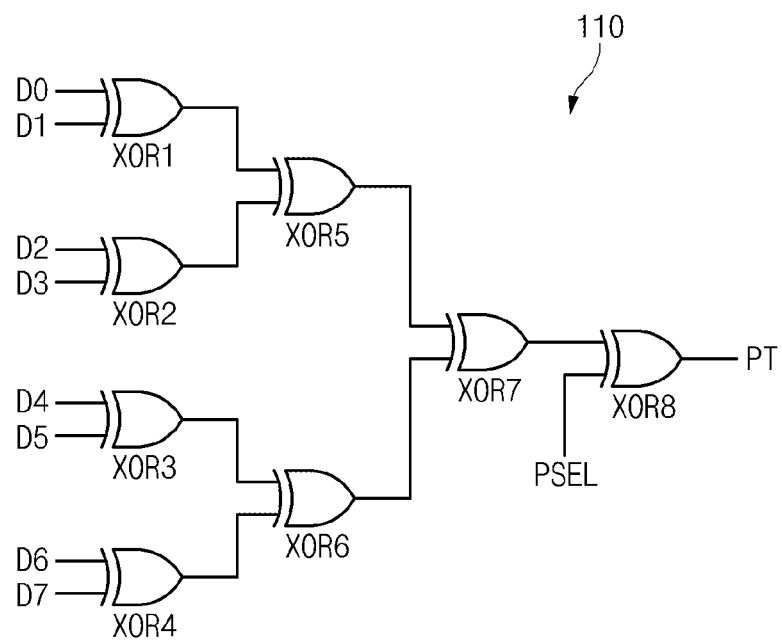
FIG. 3 is a detailed circuit diagram illustrating the parity bit generator shown in FIG. 1 according to an embodiment.

FIG. 3 is a circuit diagram illustrating the parity bit generator 110 shown in FIG. 1 according to an embodiment.

Referring to FIG. 3, the parity bit generator 110 may include a plurality of exclusive-OR (XOR) gates XOR1 through XOR7.

The first XOR gate XOR1 may perform an XOR operation on data D0 and data D1. The second XOR gate XOR2 may perform an XOR operation on data D2 and data D3.

The third XOR gate XOR3 may perform an XOR operation on data D4 and data D5. The fourth XOR gate XOR4 may perform an XOR operation on data D6 and data D7.

The fifth XOR gate XOR5 may perform an XOR operation on an output signal of the first XOR gate XOR1 and an output signal of the second XOR gate XOR2. The sixth XOR gate XOR6 may perform an XOR operation on an output signal of the third XOR gate XOR3 and an output signal of the fourth XOR gate XOR4. In addition, the seventh XOR gate XOR7 may perform an XOR operation on an output signal of the fifth XOR gate XOR5 and an output signal of the sixth XOR gate XOR6. The eight XOR gate XOR8 may perform an XOR operation on an output of the seventh XOR gate XOR7 and a parity-bit selection signal PSEL to generate a parity signal PT.

The above-mentioned parity-bit generator 110 generates parity bits using data received through the data pad P1 according to the parity-bit selection signal PSEL, and outputs the parity bits to the selector 130 (see FIG. 1). Here, the parity-bit selection signal PSEL may determine whether to detect an odd parity bit (e.g., "1") or an even parity bit (e.g., "0") from among data bits received from the data pad P1. For example, when the parity-bit selection signal PSEL has a logic high value (e.g., "1"), the number of ones in the received data may be detected. When the parity-bit selection signal PSEL has a logic low value (e.g., "0"), the number of zeros in the received data may be detected. The selection bit of the parity-bit selection signal PSEL may be set in a mode register set (MRS).

For example, when the parity-bit generator 110 is an even-parity generator and data received from the data pad P1 is set to "1 1 0 1 0 1 0 1", the parity-bit selection signal PSEL is set to "1" so that the number of odd parities (i.e., five ones) is detected from the received data.

When the parity bit generator 110 is an odd-parity generator, and data received from the data pad P1 is set to "1 1 0 1 0 1 0 1", the parity-bit selection signal PSEL is set to "0" so that the number of even parities (i.e., three zeros) is detected from the received data.

Assuming that the parity bit generator 110 of the memory 100 outputs the parity bit "1" and the parity bit decoder 210 of the SOC 200 detects the parity bit "1", this indicates a normal state; and if the parity bit decoder 210 of the SOC 200 detects the bit "0", this indicates a failure state. On the contrary, assuming that the parity bit generator 110 of the memory 100 outputs the parity bit "0", if the parity bit decoder 210 of the SOC 200 detects the parity bit "0", this indicates a normal state; and if the parity bit decoder 210 of the SOC 200 detects the parity bit "1", this indicates a failure state.

In an embodiment, during transmission of n-bit data, when the parity bit generator 110 is a typical even parity generator, the parity bit generator 110 transmits a parity bit indicating a logic high state (e.g., "1") when the number of bits indicating the logic high state among received data bits is an odd number. As a result, the total number of bits indicating the logic high state included in "n+1" bit data having the received n data bits and the parity bit becomes even. When the total number of bits indicating the logic high state among received data is an even number, the parity bit generator 110 transmits a parity bit having a logic low state (e.g., "0"). As a result, the total number of bits including the logic high state indicating the logic high state included in data having the received data bits and the parity bit also becomes even.

The error check scheme of transmitted data from the parity bit generator 110 may be implemented by various methods. In an embodiment, data transmission errors can be detected using the scheme of a Hamming code composed of parity bits. However, in some embodiments, the data errors can be detected using Cyclic Redundancy Check (CRC) or other schemes.

According to an embodiment of a semiconductor device, parity bits may be transmitted using data received through a transfer path of data mask pad, so that an additional pin for receiving the parity bits may not be used. Therefore, the parity-bit storage space of the semiconductor device according to these embodiments can be reduced in size.

Embodiments may be carried out in other ways than those specifically described herein. Embodiments are to be construed as illustrative and not restrictive.

Variations and modifications are possible in the component parts and/or arrangements in the disclosure and the drawings. Alternative uses are possible.

What is claimed is:

1. A semiconductor device comprising:
    a parity-bit generator configured to generate a parity bit signal according to a parity-bit selection signal;
    a selector configured to select one of the parity bit signal and a data mask signal in response to a selection signal, and to output the selected signal through a transfer path between the selector and a channel, wherein the data mask signal is transmitted through the transfer path in a write operation; and
    a decoder configured to receive the data mask signal from the channel and decode the data mask signal during the write operation when the selection signal has a first logic value,
    wherein the selector selects the parity bit signal received from the parity-bit generator and outputs the selected parity bit signal to the transfer path, during a read operation when the selection signal has a second logic value.

2. The semiconductor device according to claim 1, further comprising:
    a data pad configured to output data to the parity-bit generator; and
    a data mask pad configured to receive the data mask signal from the decoder.

3. The semiconductor device according to claim 2, wherein the parity-bit generator includes:
    a first exclusive-OR (XOR) gate configured to perform an XOR operation on a first bit and a second bit of the data output from the data pad; and
    a second XOR gate configured to perform an XOR operation on an output of the first XOR gate and the parity-bit selection signal.

4. The semiconductor device according to claim 3, wherein the parity-bit generator includes an even-parity generator configured to detect an odd parity of the data.

5. The semiconductor device according to claim 3, wherein the parity-bit generator includes an odd-parity generator configured to detect an even parity of the data.

6. The semiconductor device according to claim 1, wherein during the write operation, the selector does not operate in response to the selection signal.

7. The semiconductor device according to claim 1, wherein:
    during the write operation, the decoder decodes the data mask signal received from the channel; and
    during the read operation, the decoder does not operate in response to the selection signal.

8. The semiconductor device according to claim 1, wherein the parity bit signal corresponds to a first parity bit signal and the channel corresponds to a first channel, the semiconductor device further comprising:
    a data pad configured to receive a second parity bit from a second channel during the write operation of the second parity bit.

9. A semiconductor system comprising:
    a memory configured to output a parity bit during a read operation, and receive a data mask signal during a write operation; and
    a System On Chip (SOC) configured to detect an error by decoding the parity bit during the read operation, and output the data mask signal to the memory during the write operation,
    wherein the parity bit is generated in the memory based on data received from a part external to the memory,
    wherein the memory includes:
        a parity-bit generator configured to generate a parity bit signal indicative of the parity bit according to a parity-bit selection signal;
        a selector configured to select one of the parity bit signal and the data mask signal in response to a selection signal, and to output the selected signal through a transfer path between the selector and a channel, wherein the data mask signal is transmitted through the transfer path in the write operation; and
        a decoder configured to receive the data mask signal from the channel and decode the data mask signal during the write operation when the selection signal has a first logic value, and
    wherein the selector selects the parity bit signal received from the parity-bit generator and outputs the selected parity bit signal to the transfer path, during the read operation when the selection signal has a second logic value.

10. The semiconductor system according to claim 9, wherein the memory further includes:
    a data pad configured to output the data received from the part external to the memory; and
    a data mask pad configured to receive the data mask signal from the decoder.

11. The semiconductor system according to claim 9, wherein
    during the write operation, the selector does not operate in response to the selection signal.

12. The semiconductor system according to claim 9, wherein:
during the write operation, the decoder decodes the data mask signal received from the channel; and
during the read operation, the decoder does not operate in response to the selection signal.

13. The semiconductor system according to claim 9, wherein the parity bit corresponds to a first parity bit and the channel corresponds to a first channel, the semiconductor system further comprising:
a data pad configured to receive a second parity bit from a second channel during the write operation of the second parity bit.

14. The semiconductor system according to claim 9, wherein the parity-bit generator includes an even-parity generator configured to detect an odd parity of the data.

15. The semiconductor system according to claim 9, wherein the parity-bit generator includes an odd-parity generator configured to detect an even parity of the data.

16. The semiconductor system according to claim 9, wherein the SOC includes a mask pad configured to output the data mask signal to the memory during the write operation.

17. The semiconductor system according to claim 9, wherein:
the parity bit corresponds to a first parity bit; and
the SOC includes a data pad configured to output a second parity bit to the memory during the write operation of the second parity bit.

18. The semiconductor system according to claim 9, wherein the SOC includes:
a parity-bit decoder configured to detect the parity bit during the read operation.

19. The semiconductor system according to claim 18, wherein SOC further includes:
an error detector configured to detect the error using a result of the parity-bit decoder.

* * * * *